United States Patent
Zhu (10) Patent No.: US 9,660,797 B2
(45) Date of Patent: May 23, 2017

(54) METHOD AND APPARATUS FOR IMPLEMENTING CLOCK HOLDOVER

(71) Applicant: Telefonaktiebolaget L M Ericsson (publ), Stockholm (SE)

(72) Inventor: Kai Zhu, Beijing (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 14/778,440

(22) PCT Filed: Mar. 21, 2013

(86) PCT No.: PCT/CN2013/072988
§ 371 (c)(1),
(2) Date: Sep. 18, 2015

(87) PCT Pub. No.: WO2014/146274
PCT Pub. Date: Sep. 25, 2014

(65) Prior Publication Data
US 2016/0072619 A1 Mar. 10, 2016

(51) Int. Cl.
*H03L 7/08* (2006.01)
*H04L 7/033* (2006.01)
(Continued)

(52) U.S. Cl.
CPC ............... *H04L 7/033* (2013.01); *H03B 5/32* (2013.01); *H03L 7/085* (2013.01); *H03L 7/0805* (2013.01);
(Continued)

(58) Field of Classification Search
CPC . H03B 5/32; H03D 3/24; H03K 23/68; H03L 7/00; H03L 7/06; H03L 7/08;
(Continued)

(56) References Cited

U.S. PATENT DOCUMENTS

| 4,849,993 A | 7/1989 | Johnson et al. |
| 5,986,512 A | 11/1999 | Eriksson |

(Continued)

FOREIGN PATENT DOCUMENTS

| EP | 1228567 B1 | 12/2005 |
| WO | 0008763 A1 | 2/2000 |
| WO | 2014146274 A1 | 9/2014 |

OTHER PUBLICATIONS

Datta, Rajendra Nath, "Understanding the concepts of synchronization and holdover", EE Times, Available online at: http://www.eetimes.com/design/communications-design/4213947/Understanding-the-concepts-of-synchronization-and-holdover, Mar. 10, 2011, 1-4.

(Continued)

*Primary Examiner* — Shawkat M Ali
(74) *Attorney, Agent, or Firm* — Murphy, Bilak & Homiller, PLLC (57) ABSTRACT

The embodiments disclose a method and apparatus for implementing the clock holdover in the communication system. The apparatus receives an external source clock and outputs an output clock, and comprises a first phase-locked circuit and a second phase-locked circuit. The first phase-locked circuit is configured for taking the external source clock and a first output clock as input and outputting an intermediate clock, the first output clock is outputted by the second phase-locked circuit and fed back to the first phase-locked circuit. The first phase-locked circuit includes a first digital oscillator, and the first digital oscillator is configured to take the first output clock as a working clock to generate the intermediate clock. The second phase-locked circuit is configured for taking the intermediate clock and a local clock fed by a local oscillator as input, and outputting a second output clock.

15 Claims, 5 Drawing Sheets

(51) Int. Cl.
*H04J 3/06* (2006.01)
*H03L 7/085* (2006.01)
*H03L 7/087* (2006.01)
*H03L 7/093* (2006.01)
*H03L 7/099* (2006.01)
*H03L 7/14* (2006.01)
*H03B 5/32* (2006.01)

(52) U.S. Cl.
CPC .............. *H03L 7/087* (2013.01); *H03L 7/093* (2013.01); *H03L 7/0992* (2013.01); *H03L 7/14* (2013.01); *H04J 3/0688* (2013.01)

(58) Field of Classification Search
CPC ......... H03L 7/0805; H03L 7/12; H03L 7/197; H04L 7/00; H04L 7/033; H04L 7/085; H04L 25/36; H04L 27/12
USPC .............. 327/147–159; 331/2, 4, 16, 19, 23; 332/127; 375/355, 371, 375, 376
See application file for complete search history.

(56) References Cited

U.S. PATENT DOCUMENTS

| | | | | |
|---|---|---|---|---|
| 6,118,316 | A * | 9/2000 | Tamamura | H03L 7/099 327/156 |
| 6,275,553 | B1 * | 8/2001 | Esaki | H03L 7/23 327/147 |
| 6,653,874 | B2 * | 11/2003 | Ishikawa | H03L 7/093 327/144 |
| 7,039,149 | B2 * | 5/2006 | Tagami | H04L 7/033 327/156 |
| 7,148,753 | B1 * | 12/2006 | Garlepp | H03L 7/07 327/156 |
| 7,576,576 | B2 | 8/2009 | Drexler et al. | |
| 7,924,072 | B2 * | 4/2011 | Palmer | H03L 7/07 327/105 |
| 8,532,243 | B2 * | 9/2013 | Seethamraju | G06F 1/04 327/156 |
| 8,681,917 | B2 * | 3/2014 | McAllister | H04J 3/0658 375/371 |
| 8,791,734 | B1 * | 7/2014 | Hara | H03L 7/146 327/156 |
| 8,958,513 | B1 * | 2/2015 | Novellini | H04L 7/0337 375/355 |
| 2006/0056561 | A1 * | 3/2006 | Zhang | H03L 7/087 375/376 |
| 2006/0165206 | A1 | 7/2006 | Eikenbroek et al. | |
| 2007/0126514 | A1 | 6/2007 | Lin et al. | |
| 2010/0195779 | A1 * | 8/2010 | Sai | H03L 7/087 375/376 |
| 2010/0296523 | A1 * | 11/2010 | Wego | H04J 3/1623 370/503 |
| 2012/0112806 | A1 * | 5/2012 | Dayi | H03L 7/089 327/145 |
| 2012/0313676 | A1 * | 12/2012 | Nguyen | H03L 7/23 327/156 |

OTHER PUBLICATIONS

ETSI, "Transmission and Multiplexing (TM); Generic requirements for synchronization networks; Part 1: Definitions and terminology for synchronization networks", European Telecommunication Standard, ETS 300 462-1, Apr. 1997, 1-26.

Miller, Brian et al., "A Multiple Modulator Fractional Divider", IEEE Transactions on Instrumentation and Measurement, vol. 40, No. 3, Jun. 1991, 578-583.

Riley, Tom et al., "Delta-Sigma Modulation in Fractional-N Frequency Synthesis", IEEE Journal of Solid-State Circuits, vol. 28, No. 5, May 1993, 553-559.

\* cited by examiner

METHOD AND APPARATUS FOR IMPLEMENTING CLOCK HOLDOVER

TECHNICAL FIELD

The present technology generally relates to the communication technology, particularly to a method and apparatus for implementing the clock holdover in the communication system.

BACKGROUND

Synchronization and timing are essential to the telecommunications networks to ensure optimal performance and prevent packet loss, dropped frames and degradation of the quality of experience that will affect end-user services. Modern wireless communication systems require at least knowledge of frequency and often knowledge of phase as well in order to work correctly. The communication device such as base station needs to know what time it is, which usually is provided by the network clock synchronization source.

If the connection to the network clock synchronization source is lost (i.e. the network source clock is not available), the base station will have to be on its own to maintain its synchronization clock. The base station needs to find a way to establish accurate frequency and phase (to know what time it is) using internal (or local) resources, and that's where the function of holdover becomes important.

As known in the art, the clock holdover usually refers to an operation condition of a clock which has lost its controlling input, e.g. the network source clock, and is using stored data to control its output. In a typical system, a synchronization module utilizes phase-locked-loop (PLL) circuit to receive the synchronization source and generate one or more high quality clock which is suitable for use. When the synchronization source is lost, the system enters into the holdover mode. In this case, the generated clock will be based on the previously valid synchronization source.

Figure 1:
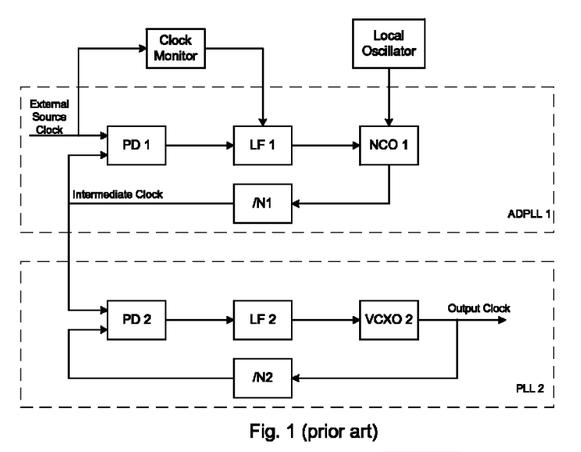
FIG. 1 schematically illustrates an exemplary clock holdover circuit topology.
Figure 2:
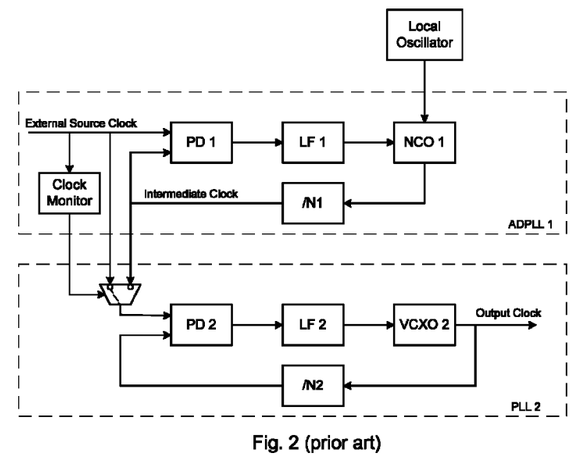
FIG. 2 schematically illustrates another exemplary clock holdover circuit topology.

Generally, there are two known circuit designs used for the clock holdover, as illustrated in FIG. 1 and FIG. 2.

In FIG. 1, the first PLL (which is usually an all digital PLL (ADPLL) 1) is connected in series with the second PLL (i.e. the PLL 2). The output signal from ADPLL 1 (marked as "Intermediate Clock") is supplied as the source clock of PLL 2. Each of the PLLs includes its own independent phase detector (PD), the loop filter (LP) and the voltage-control oscillator such as the voltage-controlled crystal oscillator (VCXO) and the numerically controlled oscillator (NCO). ADPLL 1 firstly locks to the "External Source Clock", and generates the "Intermediate Clock". PLL 2 locks to "Intermediate Clock" and generate one or more "Output Clock" in proper frequencies for the system to use. When both of the PLLs work in the normal locked state, "Intermediate Clock" tracks the frequency of "External Source Clock" and then tracked by "Output Clock".

When the "External Source Clock" fails, the system enters into the holdover mode. "LF 1" of ADPLL 1 is frozen such that the frequency control word used to drive the NCO to track the change of "External Source Clock" no longer. The frozen output of "LF 1" holds the output of NCO steadily. It is held to a value corresponding to the external source clock received prior to entering the holdover mode.

The topology in FIG. 2 represents a variation of FIG. 1. The difference is that the two PLLs are working in parallel. In the normal operational mode, a selector circuit selects an "External Source Clock" as the input of the PD 2. The "Output Clock" of PLL 2 directly tracks the frequency of the "External Source Clock" and the ADPLL 1 is working in parallel so that it can also track the frequency of the "External Source Clock". When a holdover condition occurs, the LF 1 is frozen and the selector selects the "Intermediate Clock" as the source clock of the PLL2.

The above clock holdover designs are applicable in the traditional digital telecommunications networks (TDM), where the synchronization was maintained by only two kinds of external source clocks, the primary reference clocks and distribution clocks, over a physical circuit. However, as the networks transit from the TDM networks to packet-based next generation networks, numerous external source clocks with different clock frequencies are presented and the disadvantages of the above designs are exposed.

Specifically, it is known that, for a PLL or ADPLL, the source clock frequency and local oscillator's frequency are preferred to be integral multiples/fraction of each other in the circuit. With the occurrence of the numerous external source clocks with different clock frequencies, it can not be assured that the clock frequency of the local oscillator is always the integral multiply/fraction of the frequency of the different external source clocks. For example, the network clock source may include T-carrier of pseudo-synchronous digital hierarchy (PDH), E-carrier of PDH, synchronous digital hierarchy (SDH)/Synchronous Optical Network (SONET) and SyncE/Global Position System (GPS)/Cesium, whose clock frequency values are 1.544 MHz, 2.048 MHz, multiplies of 6.48 MHz and multiplies of 5 MHz respectively. By contrast, the typical local oscillator includes the VCXO and the oven controlled crystal oscillator (OCXO). The center frequency of VCXO is 155.52 MHz or its integral multiplies, and the output frequency of OCXO is 5 MHz/10 MHz/20 MHz etc.

For both designs in FIG. 1 and FIG. 2, it is common that the "Intermediate Clock" tracks the frequency of "External Source Clock", such that both the ADPLL1 and the PLL2 are confronted with the issue of the non-integral multiple/non-fraction. Hence it becomes even more difficult for the designer to choose an appropriate frequency of the "Intermediate Clock" which is acceptable by both the ADPLL 1 and PLL 2.

In order to dynamically maintain the integral multiples/fraction relationship between the source clock frequency and local oscillator's frequency for the ADPLL 1 and PLL 2, additional work has to be done on the designs. One approach is to perform the digital non-integral division on the source clock frequency, which however will affect the performance of PD, and an appropriate frequency must be chosen carefully in order to let the PD working well on it. The other approach is to perform the digital non-integral division on the local oscillator's frequency, but it will bring jitter to the PLL's output clock. Furthermore, in order to avoid or alleviate these introduced side-effects, the ADPLL 1 and PLL 2 have to be designed in a more complex way, which in turn increases the circuit manufacture cost.

SUMMARY

Therefore, it is a strong desire to solve or mitigate at least one of the above mentioned problems.

According to an aspect of the embodiments, there is provided an apparatus for implementing clock holdover in a communication system. The apparatus receives an external source clock and outputs an output clock, and the apparatus comprises a first phase-locked circuit and a second phase-locked circuit. The first phase-locked circuit is configured for taking the external source clock and a first output clock as input and outputting an intermediate clock. The first output clock is outputted by the second phase-locked circuit and fed back to the first phase-locked circuit. The first phase-locked circuit includes a first digital oscillator, and the first digital oscillator is configured to take the first output clock as a working clock to generate the intermediate clock. The second phase-locked circuit is configured for taking the intermediate clock and a local clock fed by a local oscillator as input, and outputting a second output clock.

According to another aspect of the embodiments, there is provided a method for implementing clock holdover in a communication system. The method comprises: obtaining an external source clock and a first output clock which is outputted and fed by a second phase-locked circuit; processing the external source clock and the first output clock by a first phase-locked circuit, so as to output an intermediate clock, the first phase-locked circuit includes a first digital oscillator, and the first digital oscillator is configured for taking the first output clock as a working clock, i.e. the local oscillating source clock of the first phase-locked circuit, to generate the intermediate clock; obtaining the intermediate clock and a local clock fed by a local oscillator; and processing the intermediate clock and the local clock by the second phase-locked circuit, so as to output a second output clock.

According to a further aspect of the embodiments, there is provided a communication device comprising the apparatus for implementing clock holdover as described above.

Instead of presenting two PLLs either in serial or in parallel, the circuit design used for the clock holder according to the above embodiments integrate two phase-locked circuits into a large "nested" loop, which is also called the nested PLL. In such circuit design, the intermediate clock tracks the frequency of the output clock instead of the external source clock, thus the second phase-locked circuit will not encounter the issue of non-integral multiple/non-fraction, and only the design of the first phase-locked circuit may be left to consider the non-integral multiple/non-fraction issue. As such, the clock holdover circuit capable of coping with multiple external source clocks with different frequencies can be implemented with a relatively simple design.

BRIEF DESCRIPTION OF THE DRAWINGS

The technology will now be described, by way of example, based on embodiments with reference to the accompanying drawings, wherein.

DETAILED DESCRIPTION

Embodiments herein will be described more fully hereinafter with reference to the accompanying drawings, in which embodiments are shown. This embodiments herein may, however, be embodied in many different forms and should not be construed as limited to the embodiments set forth herein. The elements of the drawings are not necessarily to scale relative to each other. Like numbers refer to like elements throughout.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Also, use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Unless otherwise defined, all terms (including technical and scientific terms) used herein have the same meaning as commonly understood. It will be further understood that terms used herein should be interpreted as having a meaning that is consistent with their meaning in the context of this specification and the relevant art and will not be interpreted in an idealized or overly formal sense unless expressly so defined herein.

Embodiments herein will be described below with reference to the drawings.

Figure 3:
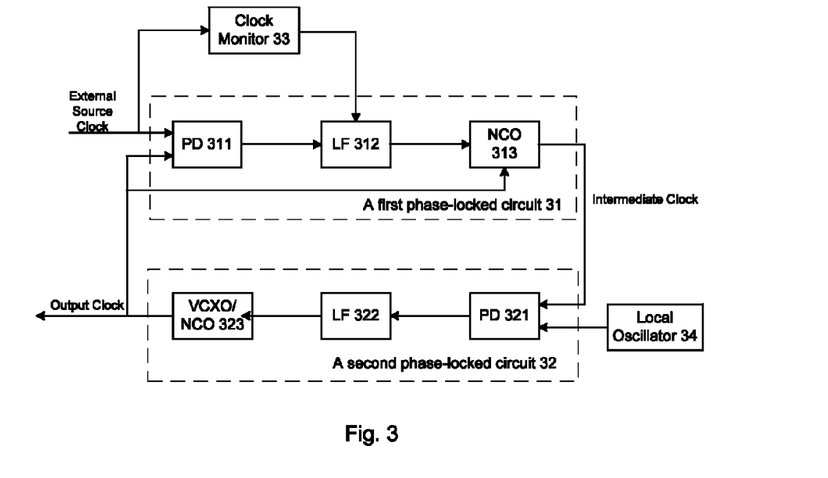
FIG. 3 schematically illustrates an apparatus for implementing the clock holdover in accordance with an embodiment.

FIG. 3 schematically illustrates an apparatus for implementing the clock holdover in accordance with an embodiment.

As illustrated in FIG. 3, the apparatus may comprise a first phase-locked circuit 31 and a second phase-locked circuit 32. Here, the phase-locked circuit may refer to a circuit that generates an output clock whose phase is associated with the phase of an input source clock. Specifically, the phase of the output clock may overlap with the phase of the input source clock, and it is also possible that a fixed non-zero phase difference is kept between the phase of the output clock and the phase of the input source clock. In addition, this apparatus can be implemented independently or as an embedded component, for example, in a communication device such as a base station or a user equipment. Now, the functions of the elements in the apparatus will be described with reference to the FIG. 3.

The first phase-locked circuit 31 may take the external source clock and a first output clock as input and output an intermediate clock. The external source clock can be provided by various clock sources, such as the traditional TDM networks, the synchronized packet networks and the common reference source like Cesium or GPS, and the like. The first output clock is previously outputted by the second phase-locked circuit 32 and fed back to the first phase-locked circuit 31. As illustrated, the first phase-locked circuit 31 may need to take the first output clock outputted by the second phase-locked circuit 32 as the working clock, i.e. the local oscillating source clock to generate the intermediate clock. Thus, preferably the first phase-locked circuit 31 is a digital phase locked circuit, which may for example comprise a PD 311, a LF 312, and a digital oscillator NCO 313, where the PD 311 is coupled with the LF 312 and the LF 312 further is coupled with the NCO 313.

Specifically, the PD 311 may receive the external source clock, and a feedback signal, i.e. the first output clock from the second phase-locked circuit 32, and then compare the phase difference between the external source clock and the first output clock, for example, by sampling a counter representative of the phase. In an embodiment, the PD 311 can be implemented as illustrated in FIG. 7.

Figure 7:
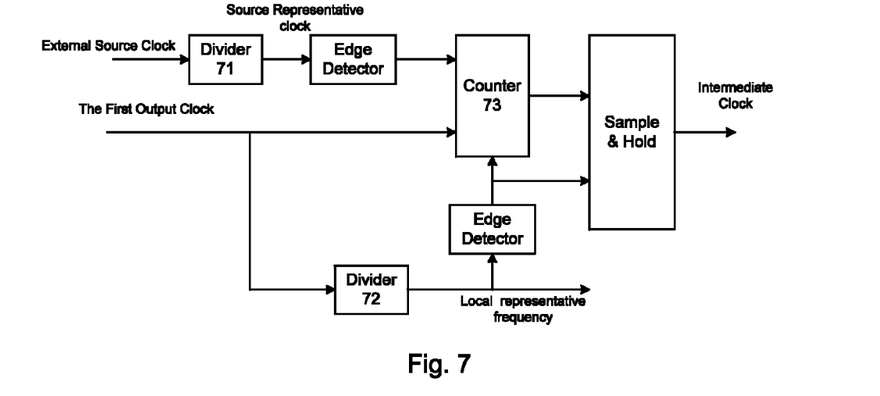
FIG. 7 schematically illustrates an exemplary structure of the PD in the first phase-locked circuit in accordance with an embodiment.

In the FIG. 7, the divider 71 divides the external source clock into a low speed source representative clock with a proper frequency, which should be the common divisor of the frequencies of the external source clock and the first output clock. For a typical telecommunication transport system, 8 kHz is one of the proper representative frequencies. The divider 72 receives the first output clock and divides it into the same representative frequency, which is the local representative frequency. The counter 73 adopts the net first output clock as its working clock to count the phase gap between the source representative clock and the local representative frequency. The output of counter 73 is sampled and held for the whole period to generate the output of PD 311.

Figure 8:
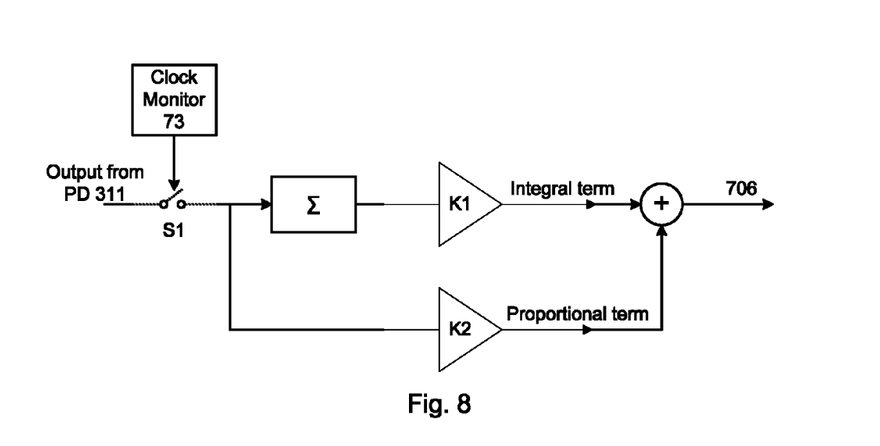
FIG. 8 schematically illustrates an exemplary structure of the LF in the first phase-locked circuit in accordance with an embodiment.

The LF 312 may receive and filter the output describing the phase difference from the PD 311. The LF 312 usually is a low-pass filter, and preferably a second order digital filter as illustrated in FIG. 8. In such LF 312, the integral term and the proportional term are added to generate the output of the loop filter. The factors K1 and K2 determine the bandwidth. Alternatively, the LF 312 may receive the output of a clock monitor that monitors the availability of the external source clock to switch to the holdover mode, which will be described later.

Figure 9:
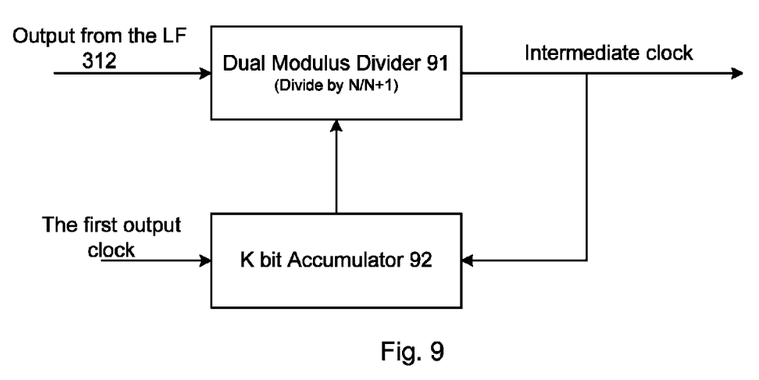
FIG. 9 schematically illustrates an exemplary structure of the NCO in the first phase-locked circuit in accordance with an embodiment.

The NCO 313 may receive the output containing the phase difference from the LF 312 and the first output clock from the second phase-locked circuit 32, and then take the first output clock as its working clock to generate the intermediate clock. In an embodiment, the NCO 313 may process the working clock based on the phase difference between the working clock (i.e. the first output clock) and the external source clock to generate the intermediate clock. For example, the NCO 313 may function as a fractional frequency divider to divide the working clock in terms of a frequency division coefficient, which is dynamically set according to the phase difference, to obtain a resulting clock with a lower frequency, where the phase of the resulting clock overlaps with the phase of the external source clock. Alternatively, the resulting clock is also allowed to keep a fixed non-zero phase difference with the external source clock as desired. Then, the resulting clock can be outputted as the intermediate clock. In an embodiment, the NCO 313 may function as a voltage controllable non-integrator frequency divider, which can be implemented as illustrated in FIG. 9. In FIG. 9, the first output clock from the second phase-locked circuit 32 is fed to the dual modulus divider 91 to provide the frequency source. The dual modulus divider 91 is a dual mode frequency divider (divide by N or N+1). It is controlled by the overflow output of the K bit accumulator 92. The K bit accumulator 92, as its name implies, is a K bits width counter that accumulates the control voltage from the output of LF 312. Once it overflows, it sends a valid signal to control the dual modulus divider 91 to serve as a "/N+1" divider, otherwise the dual modulus divider 92 serves as a "/N" divider.

Figure 4:
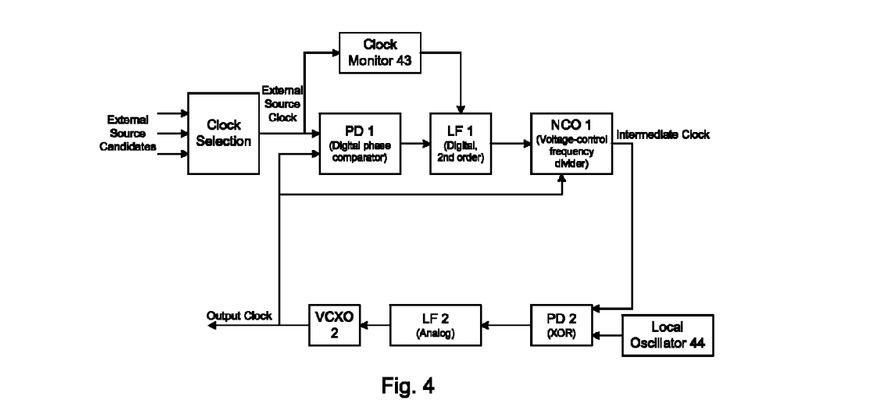
FIG. 4 schematically illustrates an example apparatus for implementing the clock holdover where the second phase-locked circuit is an analog phase-locked circuit, in accordance with an embodiment.
Figure 5:
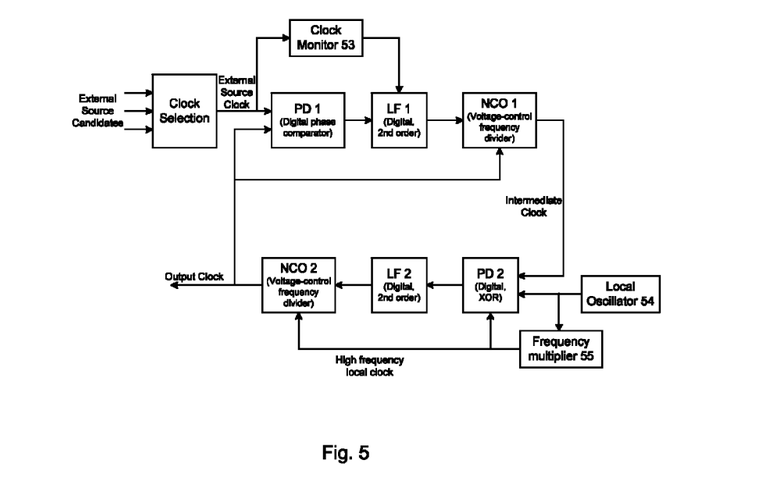
FIG. 5 schematically illustrates an example apparatus for implementing the clock holdover where the second phase-locked circuit is a digital phase-locked circuit, in accordance with another embodiment.

After the first phase-locked circuit 31 outputs the intermediate clock, the second phase-locked circuit may receive the intermediate clock, and take the intermediate clock and a local clock fed by a local oscillator, e.g. the local oscillator 34, as input to output a second output clock. Here, the second phase-locked circuit 32 can be implemented as either a digital phase-locked circuit or an analog phase-locked circuit. In an embodiment, the second phase-locked circuit 32 may comprise a PD 321, a LF 322 and a VCXO/NCO 323, where the PD 321 is coupled with the LF 322 and the LF 322 is coupled with the VCXO/NCO 323. When the second phase-locked circuit 32 is a digital phase-locked circuit, the VCXO/NCO 323 can be a NCO as illustrated in FIG. 4, and when the second phase-locked circuit 32 is an analog phase-locked circuit, the VCXO/NCO 323 can be a VCXO as illustrated in FIG. 5.

Specifically, the PD 321 may connect with the NCO 313 in the first phase-locked circuit 31 and the local oscillator 34, and receive the intermediate clock/the local clock from the NCO 313/the local oscillator 34. The local oscillator preferably is a temperature compensated crystal oscillator (TCXO) or OCXO, because they can generate the clock frequency with high accuracy and the generation is not influenced by the temperature excursion. Then the PD 321 may perform the phase comparison between the intermediate clock and the local clock. Since the PD 321 doesn't take the external source clock as the input, it will not encounter the issue of the non-integral multiple/non-fraction. In other words, the frequency of the intermediate clock always is the integral multiple/fraction of the frequency of the local clock, since the NCO 313 is a digital oscillator whose output can be advantageously adjusted in a controlled way.

Figure 10:
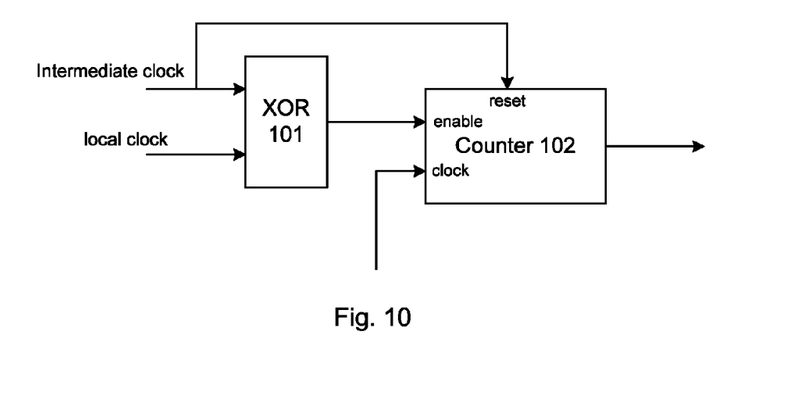
FIG. 10 schematically illustrates an exemplary structure of the PD in the second phase-locked circuit in accordance with an embodiment.

As such, the phase comparison can be performed easily by a PD 321 whose implementation is simpler than that of the PD 311. For example, if the second phase-locked circuit 32 is an analog phase-locked circuit, when the frequency of the intermediate clock is set to be identical with the frequency of the local clock, the PD 321 can simply be a XOR gate. Moreover, even if the second phase-locked circuit 32 is a digital phase-locked circuit, the PD 321 also can be easily implemented, for example, as illustrated in FIG. 10. In FIG. 10, the duty cycle of the output of XOR gate 101 may represent the phase relationship between the intermediate clock and the local clock. An additional counter 102 then may count the duty cycle of the output of the XOR gate 101 and turn it to digital represented output result. This output result is then fed to LF 322.

The LF 322 may receive and filter the output describing the phase difference from the PD 321. Here, the LF 322 functions similar to the LF 321 in the first phase-locked circuit 31, which will not be repeatedly described for conciseness. Note that, in some cases, the structure of the LF 322 can be designed in a relatively simple way, because the LF 322 and the LF 312 work in the same loop, and it is the LF 312 that is mainly responsible for jitter/wander filtering.

The VCXO/NCO 323 then may receive the output from the LF 322 and generate the second output clock. For example, if the VCXO/NCO 323 is implemented as the VCXO as illustrated in FIG. 4, the VCXO/NCO 323 may oscillate by itself, and it may take the output from the LF 322 as the input to output the second output clock by means of such working clock. For another, if the VCXO/NCO 323 is implemented as the NCO as illustrated in FIG. 5, the VCXO/NCO 323 needs to further obtain the high frequency local clock from the frequency multiplier 55, which simply multiplies the outputted local clock of the local oscillator 54 into a much higher frequency, and then takes this high frequency local clock as the working clock to output the second output clock, which is regarded as the output clock by the apparatus Alternatively, the resulting second output clock can be fed back to the first phase-locked circuit 31 as input, such that the apparatus may operate to output another new output clock. In this way, the apparatus may continuously operate to provide the phase-locked output clock in both normal operational mode and holdover mode.

It should be appreciated that the specific implementations with respect to the elements, such as PD, LF, NCO/VCXO, in the above phase-locked circuits are described by way of example, any other suitable implementations for the elements are applicable to the embodiments.

As indicated, the advantages of the embodiments mainly are embodied in the simpler design of the clock holdover circuit, especially while being used for dealing with multiple external source clocks with different frequencies.

For the existing clock holdover circuit design as shown in FIG. 1 and FIG. 2, the intermediate clock tracks the frequency of the external source clock. With the occurrence of different candidates of external source clocks, both of the PLLs in the circuit design, in particular the PD 1 and PD2 are faced with the problem of non-integral multiple/non-fraction, which requires more logic resource and increases the difficulty in circuit design.

The above embodiments mitigate such problem. For example, only the PD 311 encounters the problem of non-integral multiple/non-fraction, as such, the design of PD 321 and LF 322 can be simplified because the intermediate clock and the local clock fed by the local oscillator 34 are of the same nominal frequency. For example, the PD 321 can be as simple as an XOR gate, and the bandwidth of the LF 322 can be loose because it works with the LF 312 in the same loop, and it is the LF 312 that is mainly responsible for jitter/wander filtering.

Alternatively, the apparatus may further comprise a clock monitor, e.g. the clock monitor 33 as shown in FIG. 3. The clock monitor may monitor the availability of the external source clock so as to switch to the holdover mode. In an embodiment, the clock monitor 33 is coupled with the LF 312 whose structure is shown in FIG. 8. Now referring to the FIG. 3 and FIG. 8, the clock monitor 73 represents the clock monitor 33. During the normal operation, the clock monitor can successfully detect the external source clock, and the switch S1 is closed. However, when the clock monitor detects that the external source clock is not available or invalid, for example, by clock loss detection, it may control the switch S1 to open, thereby disconnecting the LF 312 with the PD 311. In this case, the apparatus enters into the holdover mode. And the holdover is achieved by freezing the integrator and disabling the K1 term in the LF 312. In this way, the output value of the freezing integrator is fixed, which may record the frequency difference between the external source clock and the local clock before the external source clock is lost.

It should be understood that the utilization of the clock monitor is simply an exemplary way to switch to the holdover mode, and other known ways are also applicable to the embodiments.

Furthermore, a communication device is proposed, which may comprise the apparatus as described above so as to implement the clock holdover in the communication system. The communication device may refer to the one that needs to maintain the clock synchronization with the communication network even in absence of the synchronization source, including, either the wired device and the wireless device, either the communication node such as base station, femto base station, NodeB, e-NodeB, access point (AP), etc or the user equipment such as mobile phone, smart phone, Personal Digital Assistant (PDA), and the like.

Figure 6:
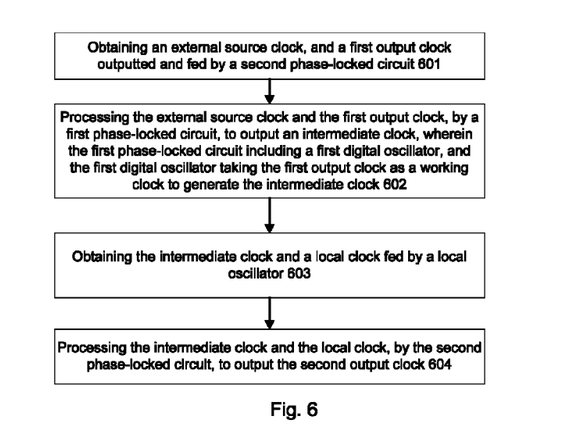
FIG. 6 schematically illustrates a flowchart of implementing clock holdover in a communication system in accordance with an embodiment.

FIG. 6 schematically illustrates a flowchart of implementing clock holdover in a communication system in accordance with an embodiment. In the embodiment, the method can be performed by the apparatus as illustrated in FIG. 3, which comprise the first phase-locked circuit 31 and the second phase-locked circuit 32. It should be appreciated that the method may also be performed by other suitable designed circuits. Now the process of the method will be described in detail with reference to the FIG. 3 and FIG. 6.

In step 601, the apparatus, in particular the first phase-locked circuit 31, may obtain an external source clock, and meanwhile keep a first output clock outputted and fed by a second phase-locked circuit (e.g. the circuit 32) in the apparatus. The external source clock can be provided by various clock sources, such as the traditional TDM networks, the synchronized packet networks and the common reference source like Cesium or GPS, and the like.

In step 602, the apparatus may processing the external source clock and the first output clock, by the first phase-locked circuit (e.g. the circuit 31), to output an intermediate clock. As illustrated, the first phase-locked circuit 31 may need to take the first output clock outputted by the second phase-locked circuit 32 as the working clock to generate the intermediate clock, Thus, preferably the first phase-locked circuit 31 is a digital phase locked circuit, which may for example comprise a PD 311, a LF 312, and a digital oscillator NCO 313, where the PD 311 is coupled with the LF 312 and the LF 312 further is coupled with the NCO 313.

Specifically, for example, the PD 311 in the first phase-locked circuit 31 firstly may compare the phase difference between the external source clock and the first output clock, for example, by sampling a counter representative of the phase. Subsequently, the LF 312 in the first phase-locked circuit 31 may receive and filter the output describing the phase difference from the PD 311. The LF 312 usually is a low-pass filter, and preferably a second order digital filter as illustrated in FIG. 8. Finally, the NCO 313 in the first phase-locked circuit 31 may receive the output from the LF 312 and the first output clock from the second phase-locked circuit 32, and then takes the first output clock as its working clock to generate the intermediate clock. For example, the NCO 313 may process the working clock based on the phase difference between the working clock (i.e. the first output clock) and the external source clock to generate the intermediate clock. For example, the NCO 313 may function as a fractional frequency divider to divide the working clock in terms of a frequency division coefficient, which is dynamically set according to the phase difference, to obtain a resulting clock with a lower frequency, where the phase of the resulting clock overlaps with the phase of the external source clock. Alternatively, the resulting clock is also allowed to keep a fixed non-zero phase difference with the external source clock as desired. Then, the resulting clock can be outputted as the intermediate clock. In an embodiment, the NCO 313 may function as a voltage controllable non-integrator frequency divider, which can be implemented as illustrated in FIG. 9.

In step 603, the apparatus, in particular the second phase-locked circuit (e.g. the circuit 32) may obtain the intermediate clock from the first phase-locked circuit (e.g. the circuit 32) and a local clock from a local oscillator (e.g. the local oscillator 34).

Here, the phase-locked circuit 32 can be implemented as either a digital phase-locked circuit or an analog phase-locked circuit. In an embodiment, the second phase-locked circuit 32 may comprise a PD 321, a LF 322 and a VCXO/NCO 323, where the PD 321 is coupled with the LF 322 and the LF 322 is coupled with the VCXO/NCO 323. If the second phase-locked circuit 32 is a digital phase-locked circuit, the VCXO/NCO 323 can be a NCO as illustrated in FIG. 4, and if the second phase-locked circuit 32 is an analog phase-locked circuit, the VCXO/NCO 323 can be a VCXO as illustrated in FIG. 5.

The local oscillator preferably is a TCXO or OCXO, because they can generate the clock frequency with high accuracy and the generation is not influenced by the temperature excursion.

In step 604, the apparatus may process the intermediate clock and the local clock, by the second phase-locked circuit (e.g. the circuit 32), to output a second output clock.

Specifically, for example, the PD 321 in the second phase-locked circuit 32 may firstly perform the phase comparison between the intermediate clock and the local clock. Since the PD 321 doesn't take the external source clock as the input, it will not encounter the issue of the non-integral multiple/non-fraction. In other words, the frequency of the intermediate clock is always the integral multiple/fraction of the frequency of the local clock, since the NCO 313 is a digital oscillator whose output can be advantageously adjusted in a controlled way. As such, the phase comparison can be performed easily by a PD whose implementation is simpler than that of the PD 311. For example, if the second phase-locked circuit 32 is an analog phase-locked circuit, when the frequency of the intermediate clock is set to be identical with the frequency of the local clock, the PD 321 can simply be a XOR gate. Moreover, even if the second phase-locked circuit 32 is a digital phase-locked circuit, the PD 321 also can be easily implemented, for example, as illustrated in FIG. 10.

Then, the LF 322 in the second phase-locked circuit 32 may receive and filter the output describing the phase difference from the PD 321. Note that, in some cases, the structure of the LF 322 can be designed in a relatively simple way, because the LF 322 and the LF 312 work in the same loop, and it is the LF 312 that is mainly responsible for jitter/wander filtering.

Finally, the VCXO/NCO 323 in the second phase-locked circuit 32 may receive the output from the LF 322 and generate the second output clock. For example, if the VCXO/NCO 323 is implemented as the VCXO as illustrated in FIG. 4, the VCXO may oscillate by itself, and it may take the output from the LF 322 as the input to output the second output clock by means of such working clock. For another, if the VCXO/NCO 323 is implemented as the NCO as illustrated in FIG. 5, the NCO needs to further obtain the high frequency local clock from the frequency multiplier 55, which simply multiplies the outputted local clock of the local oscillator 54 into a much higher frequency, and then takes this high frequency local clock as working clock to output the second output clock.

Alternatively, the resulting second output clock can be fed back to the first phase-locked circuit 31 as input, such that the method may be repeatedly performed to output another new output clock. In this way, the phase-locked output clock can be continuously provided in both normal operational mode and holdover mode.

Alternatively, the apparatus may further monitor the availability of the external source clock so as to switch to the holdover mode. In an embodiment, for example, during the normal operation, the apparatus may successfully detect the external source clock. However, when it detects that the external source clock is not available or invalid; the apparatus may control to disconnect the LF 312 with the PD 311. In this case, the apparatus enters into the holdover mode. And the holdover is achieved by freezing the integrator and disabling the K1 term in LF 312. In this way, the output value of the freezing integrator is fixed, which may record the frequency difference between the external source clock and the local clock before the external source clock is lost.

While the embodiments have been illustrated and described herein, it will be understood by those skilled in the art that various changes and modifications may be made, and equivalents may be substituted for elements thereof without departing from the true scope of the present technology. In addition, many modifications may be made to adapt to a particular situation and the teaching herein without departing from its central scope. Therefore it is intended that the present embodiments not be limited to the particular embodiment disclosed as the best mode contemplated for carrying out the present technology, but that the present embodiments include all embodiments falling within the scope of the appended claims.

The invention claimed is:

1. An apparatus for implementing clock holdover in a communication system, the apparatus being configured to receive an external source clock and output an output clock, the apparatus comprising:
   a first phase-locked circuit configured to take the external source clock and a first output clock as input, and to output an intermediate clock, wherein the first phase-locked circuit includes a first digital oscillator configured to take the first output clock as a working clock to generate the intermediate clock; and
   a second phase-locked circuit configured to take the intermediate clock and a local clock fed by a local oscillator as input, and to output the first output clock, for feeding back to the first phase-locked circuit.

2. The apparatus of claim 1, wherein the first phase-locked circuit comprises a first phase detector (PD) for comparing a phase difference between the external source clock and the first output clock.

3. The apparatus of claim 2, wherein the first digital oscillator is configured to process the first output clock based on the phase difference to generate the intermediate clock, such that a phase of the intermediate clock is associated with a phase of the external source clock.

4. The apparatus of claim 1, wherein the second phase-locked circuit is an analog phase-locked circuit including a second phase detector (PD) for comparing the intermediate clock and the local clock in the second phase-locked circuit.

5. The apparatus of claim 4, wherein the second PD is an Exclusive OR (XOR) gate.

6. The apparatus of claim 1, wherein the apparatus further comprises a clock monitor circuit configured to monitor the external source clock, wherein the clock monitor circuit is configured to, when the external source clock is not available, control the first phase-locked circuit to maintain a constant output of the last intermediate clock generated before the external source clock is lost.

7. The apparatus of claim 1, wherein the local oscillator is a temperature compensated crystal oscillator (TCXO) or an oven controlled crystal oscillator (OCXO).

8. A communication device comprising the apparatus of claim 1.

9. The communication device of claim 8, wherein the communication device is a base station or a user equipment.

10. A method for implementing clock holdover in a communication system, comprising:
   in a first phase-locked circuit, obtaining an external source clock, and a first output clock outputted and fed by a second phase-locked circuit, and processing the external source clock and the first output clock, by the first phase-locked circuit, to output an intermediate clock, wherein the first phase-locked circuit includes a first digital oscillator, and wherein the first digital oscillator takes the first output clock as a working clock to generate the intermediate clock; and
   in the second phase-locked circuit, obtaining the intermediate clock and a local clock fed by a local oscillator, and processing the intermediate clock and the local clock, by the second phase-locked circuit, to output the first output clock for feeding to the first phase-locked circuit.

11. The method of claim 10, wherein said processing the external source clock and the first output clock in the first phase-locked circuit to output the intermediate clock comprises comparing a phase difference between the external source clock and the first output clock.

12. The method of claim 11, wherein said processing the external source clock and the first output clock in the first phase-locked circuit to output the intermediate clock further comprises processing the working clock based on the phase difference to generate the intermediate clock such that a phase of the intermediate clock is associated with a phase of the external source clock.

13. The method of claim 10, wherein the second phase-locked circuit is an analog phase-locked circuit including a phase detector (PD) for comparing the intermediate clock and the local clock in the second phase-locked circuit.

14. The method of claim 10, wherein the method further comprises monitoring the external source clock and, when the external source clock is not available, controlling the first phase-locked circuit to maintain a constant output of the last intermediate clock generated before the external source clock is lost.

15. The method of claim 10, wherein the local oscillator is a temperature compensated crystal oscillator (TCXO) or an oven controlled crystal oscillator (OCXO).

\* \* \* \* \*